(12) United States Patent
Cheng et al.

(10) Patent No.: US 11,600,356 B1
(45) Date of Patent: Mar. 7, 2023

(54) MEMORY DEVICE CAPABLE OF REPAIRING DEFECTIVE WORD LINES

(71) Applicant: Winbond Electronics Corp., Taichung (TW)

(72) Inventors: Kan-Yuan Cheng, San Jose, CA (US);
Hee-Seong Kim, San Jose, CA (US);
Sangho Shin, San Jose, CA (US);
Tien-Chieh Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/476,496

(22) Filed: Sep. 16, 2021

(51) Int. Cl.
| | |
|---|---|
| *G11C 29/44* | (2006.01) |
| *G11C 29/36* | (2006.01) |
| *G11C 29/00* | (2006.01) |
| *G11C 29/18* | (2006.01) |
| *G11C 29/12* | (2006.01) |

(52) U.S. Cl.
CPC .......... *G11C 29/4401* (2013.01); *G11C 29/18* (2013.01); *G11C 29/36* (2013.01); *G11C 29/787* (2013.01); *G11C 2029/1202* (2013.01)

(58) Field of Classification Search
CPC ...... G11C 29/4401; G11C 29/18; G11C 29/36
See application file for complete search history.

(56) References Cited

U.S. PATENT DOCUMENTS

| | | |
|---|---|---|
| 2003/0123301 A1 | 7/2003 | Jang et al. |
| 2020/0151070 A1 * | 5/2020 | Lee .......................... G06F 12/10 |
| 2021/0193241 A1 * | 6/2021 | Jung ...................... G11C 17/18 |

FOREIGN PATENT DOCUMENTS

| | | |
|---|---|---|
| CN | 101409110 | 4/2009 |
| TW | 201642273 | 12/2016 |
| TW | I579862 | 4/2017 |
| TW | 201820345 | 6/2018 |

\* cited by examiner

*Primary Examiner* — Mohammed A Bashar
(74) *Attorney, Agent, or Firm* — JCIPRNET (57) ABSTRACT

The disclosure provides a memory device which includes a plurality of word lines grouped into a plurality of WL sets; and a plurality of redundant word lines grouped into M RWL sets; and a memory control circuit connected to the WL sets and the RWL sets and configured to replace a plurality of defective WL sets of the plurality WL sets by selecting from the RWL sets, wherein each of the plurality of defective WL sets comprises at least a defective word line, all of the M RWL sets are available for repairing the WL sets during a wafer stage, where M is an integer greater than 2, and N of M RWL sets is available for repairing the WL sets during the wafer stage, during a package stage and during a post package stage, where N is an integer less than M.

19 Claims, 6 Drawing Sheets

FIG. 1

| Bank0 | Bank1 | Bank4 | Bank5 |
|---|---|---|---|
| periphery circuit | | | |
| Bank2 | Bank3 | Bank6 | Bank7 |

MEMORY DEVICE CAPABLE OF REPAIRING DEFECTIVE WORD LINES

TECHNICAL FIELD

The disclosure is directed to a memory device capable of repairing defective word lines.

BACKGROUND

Typically, for a memory device such as a dynamic random-access memory (DRAM) or other similar devices, the memory device may undergo multiple stages during which each defective word line (WL) could be repaired by replacing the defective WL with a redundant word line (RWL). A first repair operation could be performed during a wafer stage. During the wafer stage, repair operations of defective WLs are performed before the wafer is cut into a die which is then subsequently packaged. Several defective WLs could be repaired by RWLs. After the die in which the memory device exists has been packaged, the memory device may undergo a second repair operation during a package stage when one or more defective WLs could be repaired by RWLs before the memory device is shipped to a vendor. For a memory device such as a double rata rate 4 synchronous DRAM (DDR4) for example, a third repair operation including a hard post package repair (hppr) and/or a soft post package repair (sppr) may occur during a post package stage as defined in a Joint Electron Device Engineering Council (JEDEC) standard to allow the memory device to be repaired after the memory device has been in use by a user.

Since at least three repair operations may occur in at least three different stages, namely the wafer stage, the package stage, and the post package stage, RWLs would need to be allocated for performing repair operations during different stages. Conventionally, the repair operations are performed by dividing the RWLs into three non-overlapping portions with each portion dedicated for one of the three stages.

Figure 1:
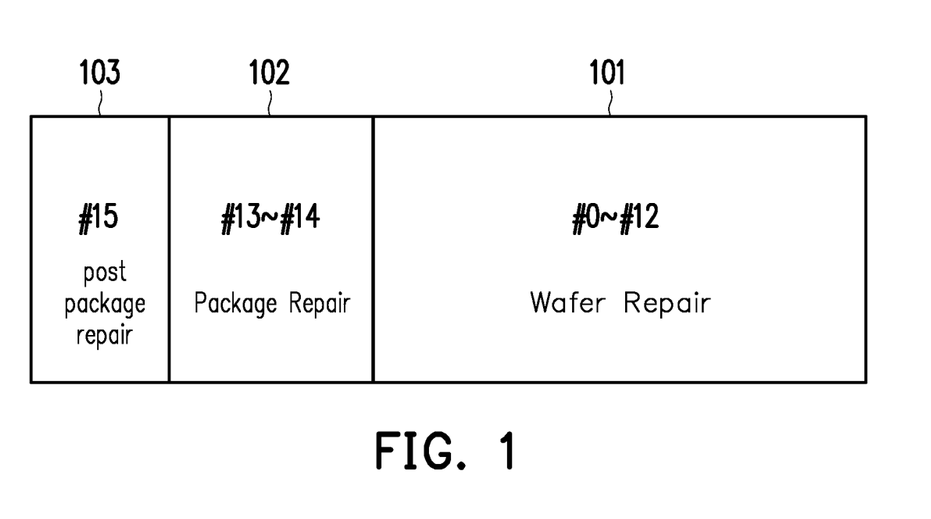
FIG. 1 shows a WL repair scheme.

FIG. 1 shows an example of using 16 rows of RWLs for repairing defective WLs, and such RWLs are divided into three regions 101~103. The RWLs #0~#12 in the first region 101 are allocated for exclusively repairing defective WLs during the wafer stage, the RWLs #13~#14 in the second region 102 are allocated for exclusively repairing defective WLs in the package stage, and the RWL #15 in the third region 103 is allocated for exclusively repairing defective WLs in the post package stage.

However, the above described repair scheme might not the most efficient scheme which would result in a high level of RWL utilization rate. Instead of dividing RWLs into three non-overlapping regions with each region allocated to each of the three stages, the repair scheme could be made to be more flexible so as to improve the utilization rate of the RWLs and to decrease the hardware costs of the repairs.

SUMMARY OF THE DISCLOSURE

The disclosure provides a memory device capable of repairing defective word lines.

The disclosure provides a memory device which includes not limited to a plurality of word lines grouped into a plurality of WL sets; and a plurality of redundant word lines grouped into M RWL sets; and a memory control circuit connected to the WL sets and the RWL sets and configured to replace a plurality of defective WL sets of the plurality WL sets by selecting from the RWL sets, wherein each of the plurality of defective WL sets comprises at least a defective word line, all of the M RWL sets are available for repairing the WL sets during a wafer stage, where M is an integer greater than 2, and N of M RWL sets is available for repairing the WL sets during the wafer stage, during a package stage and during a post package stage, where N is an integer less than M.

DETAILED DESCRIPTION OF DISCLOSED EMBODIMENTS

Reference will now be made in detail to the present exemplary embodiments of the disclosure, examples of which are illustrated in the accompanying drawings. Wherever possible, the same reference numbers are used in the drawings and the description to refer to the same or like parts.

In order to increase the availability of redundant word lines (RWLs) for performing word line (WL) repairs at each of the three stages as previously described within a reasonable hardware cost, the disclosure provides a memory device and a repairing method of the memory device. In this disclosure, M RWL sets are provided to be available to potentially repair defective WL sets in a memory bank during each of the three stages. During the wafer stage, all the M RWL sets could be utilized for repairing defective WL sets, where M could be any integer greater than or equal to 3. Among the M RWL sets, N RWL sets could be flexibly allocated for repairing defective WL sets during the package stage and the post package stage, where N is an integer and is a subset of M. In other words, instead of having a fixed region allocated exclusively for repairing defective WL sets during each of the three stages, in this disclosure, the N of the M RWL sets could be available for repairing defective WL sets during all the three stages. As a result, the utilization rate of the M RWL sets is improved. It is worth noting that a post package repair may include a hard post package repair (hppr) and a soft post package repair (sppr), but for this disclosure, for the ease of explanations, hppr and sppr are assumed to be the same.

Figure 2:
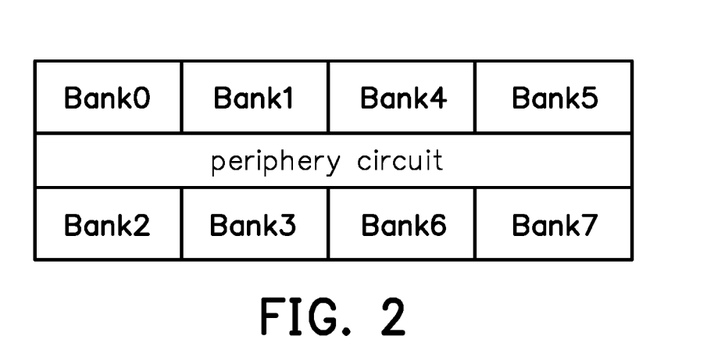
FIG. 2 shows a data storage device having a plurality of data banks.
Figure 3:
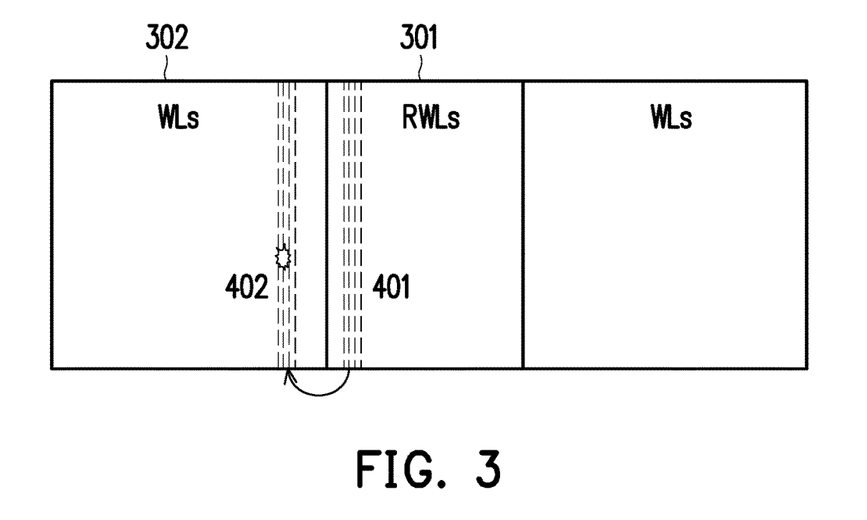
FIG. 3 shows using RWLs to repair WLs.

Referring to FIG. 2, a memory device such as DDR3 or DDR4 DRAM for example may typically include not limited to eight memory banks Bank0~Bank7. A memory bank, for example as shown in FIG. 3, may include multiple RWLs 301 which are allocated for repairing WLs 302 in the bank. The multiple RWLs 301 could be grouped into multiple RWL sets. As shown in FIG. 3, the RWL set 401 is used to replace the WL set 402, the WLs of the WL set 402 could be in the same quantity as the RWLs of the RWLs set 401.

Figure 4:
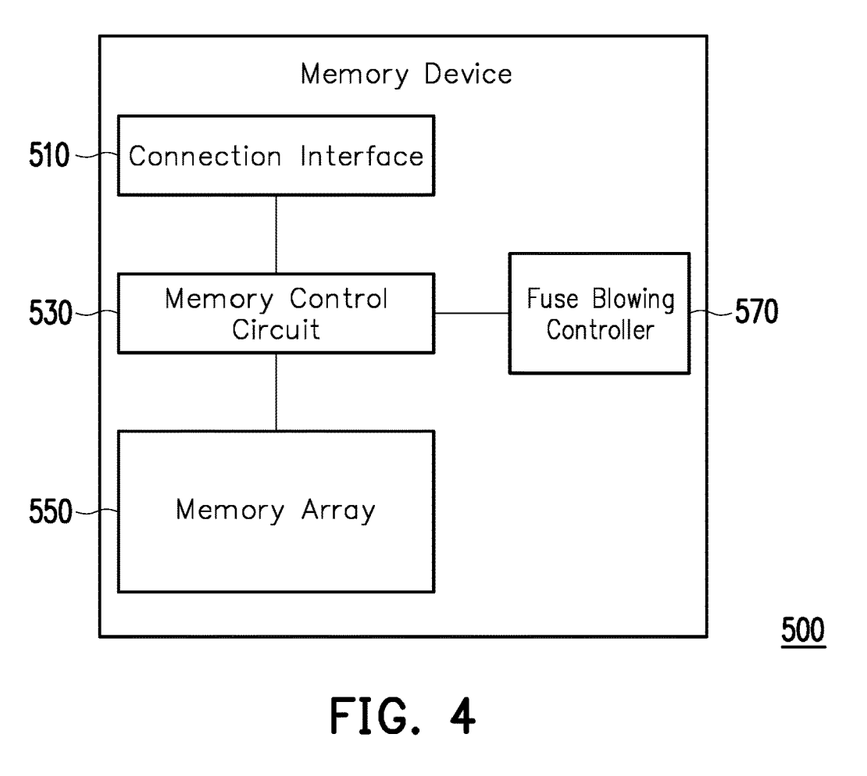
FIG. 4 shows a block diagram of a memory device.

FIG. 4 illustrates a hardware block diagram of an exemplary memory device 500 which, for example, could be a DRAM or other similar memory device. The memory device 500 includes not limited to a memory control circuit 530 electrically connected to a connection interface 510, a memory array 550 having multiple memory banks as shown in FIG. 2, and a fuse blowing controller 570.

In one embodiment, the memory control circuit 530 could be configured to receive an external command (e.g. active command, write command, and etc) which accesses the memory array 550 through the connection interface 510. The memory array 550 may include one or more memory banks each having a plurality of WLs, a plurality of RWLs, and a plurality of fuses sets. The plurality of WLs are grouped into multiple WL sets and the plurality of RWLs are grouped into multiple RWL sets, wherein each WL set and each RWL set have the same quantity of WLs and RWLs. The plurality of fuse sets are used for recording the addresses of defective WL sets during a wafer stage, a package stage, and a post package stage. The RWL sets are used to repair (replace) the defective WL sets. Specifically, when any WL set containing a defective WL (herein after referred as "defective WL set") is found during the three stages, the addresses of the defective WL set would be recorded in one of the fuse sets. Then, if the addresses of a defective WL set recorded in the fuse sets are accessed by an external command, a corresponding RWL set is selected to replace the defective WL set.

In one embodiment, each of the memory bank of memory array 550 includes a plurality of WL sets, M RWL sets indexed from #0 to #M−1 and M+K+L fuse sets indexed from #0 to #M+K+L−1, wherein M≥3, K≥1, and K≥1. Each of the fuse sets comprises a plurality of fuses used to record the addresses of a defective WL set and to record the availability of the fuse set.

The fuse blowing controller 570 is connected to memory control circuit 530 and the memory array 550 so as to receive the addresses of defective WL sets and defective RWL sets. The fuse blowing controller 570 is configured to record the addresses of defective WL sets by blowing the fuses of the fuse sets. The fuse blowing controller 570 is also configured to mark the fuse sets which have been used to record the addresses of defective WL sets or the fuse sets which corresponds to the defective RWL set as being unavailable. In one embodiment, each of the fuse sets may comprise at least one fuse dedicate for recording the availability of the fuse set, and the fuse blowing controller 570 can be configured to blow the fuse dedicate for recording the availability so as to mark the fuse set as being unavailable. In other embodiments, the fuse sets can also be marked as being unavailable by different techniques, this disclosure is not limited thereto.

Among the M+K+L fuse sets, M fuse sets indexed from #0 to #M−1 are grouped into a first fuse set group, K fuse sets indexed from #M to #M+K−1 are grouped into a second fuse set group, and L fuse sets indexed from #M+K to #M+K+L−1 are grouped into a third fuse set group. The first fuse set group is used to record addresses of defective WL sets during wafer stage exclusively, the second fuse set group is used to record addresses of defective WL sets during package stage exclusively, and the third fuse set group is used to record addresses of defective WL sets during post package stage exclusively. In an alternate embodiment, the second and third fuse set group dedicated to package repair and post package repair could be shared by more than one bank. In this alternate embodiment, in addition to the fuses recording addresses of defective WL sets, each of these fuse sets may consider additional fuses which record the bank information of the defective WL sets repaired.

Each fuse set of the first fuse set group is pre-configured to correspond to an RWL set of the M RWL sets. For example, fuse set #0 corresponds to RWL set #0, fuse set #1 corresponds to RWL set #1, and so forth. In other words, all the M RWL sets are pre-configured to be available to replace the defective WL sets during the wafer stage.

In this embodiment, the RWL sets with the N highest index numbers (hereinafter referred as "last N RWL sets") could be configured to be available to replace the defective WL sets during the package stage and the post package stage, wherein N≥L+K. In other words, the total amount of the fuse sets of the second and third fuse set group would be less than or equal to N.

The memory control circuit 530 would coordinate among the connection interface 510, the memory array 550, and the fuse blowing controller 570 to execute various functions related to the disclosure.

Figure 5:
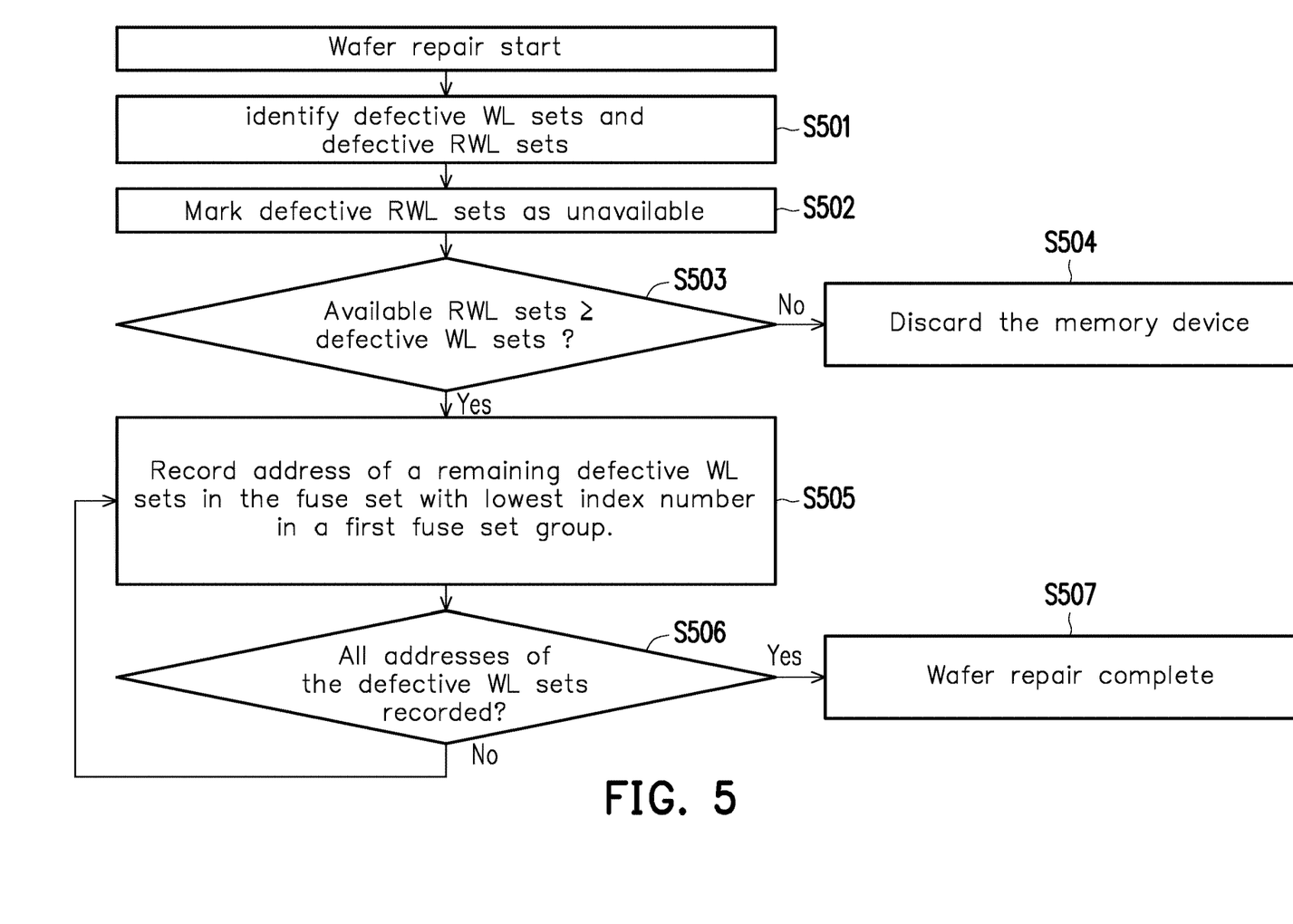
FIG. 5 shows a repair procedure of the memory device during the wafer stage.
Figure 6:
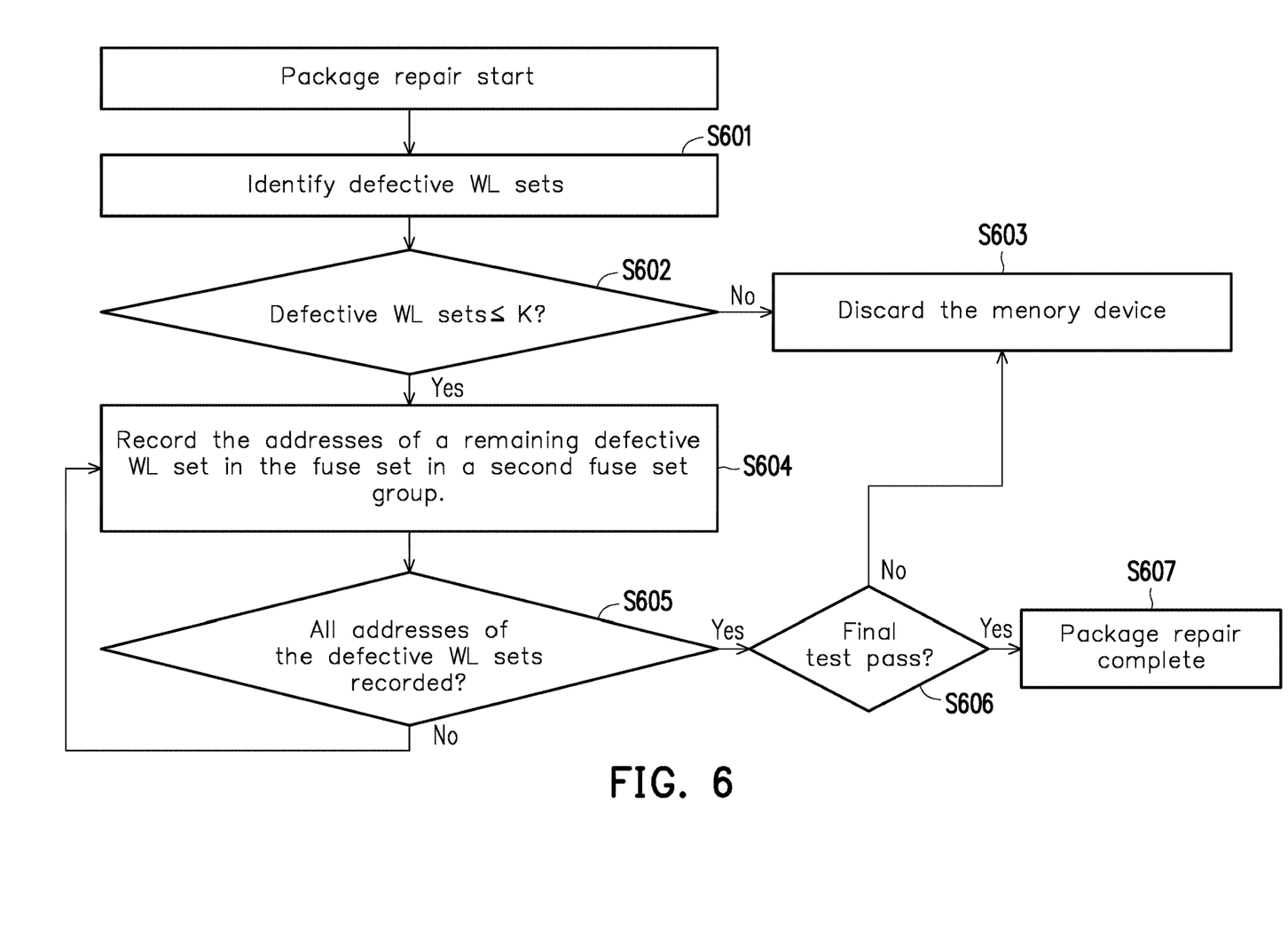
FIG. 6 shows a repair procedure of the memory device during the package stage.

The repair operation of the memory device 500 of FIG. 4 is further elucidated by the following exemplary embodiment as shown in FIGS. 5~6. FIG. 5 shows the repair procedure of the memory device 500 during the wafer stage. FIG. 6 shows the repair procedure of the memory device 500 during the package stage.

Referring to FIGS. 4 and 5, in step S501, a test is initiated to identify defective WL sets and defective RWL sets. In step S502, the defective RWL sets would be marked as being unavailable. Specifically, the fuse blowing controller 570 may be configured to select the fuse sets of a first fuse set group corresponding to the defective RWL sets and mark the selected fuse set as being unavailable. In step S503, the number of available RWL sets is compared with the number of defective WL sets. If the number of available RWL sets is less than the number of defective WL sets, then in step S504 the memory device 500 is discarded. If the number of available RWL sets is more than or equals to the number of defective WL sets, then in step S505, the fuse blowing controller 570 may be configured to select a fuse set of a first fuse set group corresponding to an available RWL set, record the addresses of a remaining defective WL set in the selected fuse set, and mark the selected fuse set as being unavailable. In this embodiment, the fuse set is selected with the lowest index number in step S505. In step S506, it is determined whether the addresses of all defective WL sets are recorded. If not, then the procedure would proceed from step S505. If yes, then in step S507, the wafer repair has been completed.

Referring to the loop of step S505~S506, in this embodiment, the fuse set of first fuse set group is selected in an order which the one with the lowest index number is selected first (i.e. in an ascending order). In an alternative embodiment, the fuse set of first fuse set group can be selected in any predetermined order. For example, the fuse set of first fuse set group can be selected in an order which the one with the highest index number is selected first (i.e. in a descending order), in this example, the fuse set is selected with the highest index number in step S505.

Referring to FIGS. 4 and 6, in step S601, a test is initiated to identify defective WL sets. In step S602, the number of defective WL sets identified in step S601 is compared to the number of the fuse sets in the second fuse set group. Specifically, it is determined if the number of defective WL sets identified in step S601 is less than or equal to K. If the number of defective WL sets is more than K, then in step S603 the memory device 500 is discarded. If the number of defective WL sets is less than or equal to K, then in step S604, the fuse blowing controller 570 may be configured to select a fuse set of the second fuse set group and record the addresses of a remaining defective WL set identified in step S601 in the selected fuse set. In this embodiment, the fuse set is selected with the highest index number in step S604. In step S605, it is determined whether the addresses of all defective WL sets are recorded. If not, then the procedure would proceed from step S604. If yes, then in step S606, a final test is proceeded to determine whether there are enough available RWL sets among the last N RWL sets to replace the defective WL sets recorded in the second fuse set group. If the final test pass, then in step S607, the package repair has been completed. If the final test fail, then in step S603, the memory device 500 is discarded.

Finally, when the memory device 500 is used by the user during the post package stage, the user can record the addresses of the defective WL set in the fuse sets of the third fuse set group.

Figure 7:
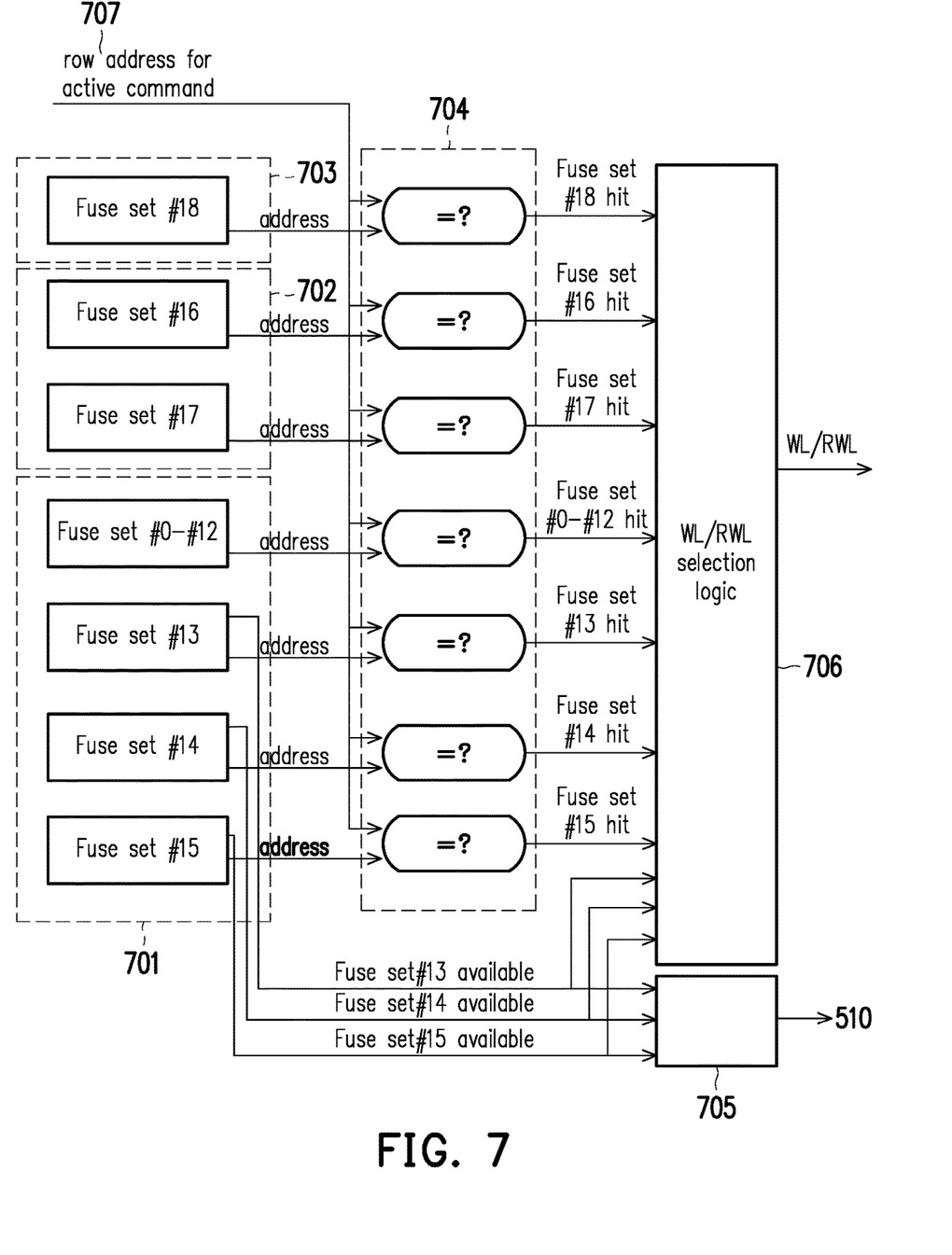
FIG. 7 shows a hardware diagram of the memory device with further details.

FIG. 7 shows a hardware diagram of memory device 500 of FIG. 4 with further details. Referring to FIGS. 4 and 7, each memory bank of the memory array 550 comprises three fuse set groups 701~703 for recording the addresses of the defective WL sets during the three repair stages. The first fuse set group 801 includes M fuse sets, the second fuse set group 702 includes K fuse sets, and the third fuse set group 803 includes L fuse sets. In this embodiment, it is assumed M=16, K=2, and L=1. Namely, the first fuse set group 701 includes sixteen fuse sets #0~#15, the second fuse set group 702 includes two fuse sets #16~#17, and the third fuse set group 703 includes one fuse set #18.

The fuse sets of fuse set groups 701~703 are pre-configured to be available to be blown by the fuse blowing controller 570 so as to record the addresses of defective WL sets during different repair stages. Specifically, the fuse blowing controller 570 would be configured to blow the fuse sets of the first fuse set group 701 for recording the addresses of defective WL sets during the wafer stage, blow the fuse sets of the second fuse set group 702 for recording the addresses of defective WL sets during the package stage, and blow the fuse sets of the third fuse set group 703 for recording the addresses of defective WL sets during post package stage. The fuse sets being used would then be marked as being unavailable.

Each fuse set of the first fuse set group 701 is pre-configured to correspond to one RWL set of the M RWL sets. When the addresses of the defective WL sets recorded in fuse sets #0~#15 are accessed, the memory control circuit 530 would select a corresponding RWL to replace the defective WL sets.

Each fuse set of the second fuse set group 702 and the third fuse set group 803 is not pre-configured to correspond any RWL sets. When the addresses of the defective WL sets recorded in fuse sets #16~#18 are accessed, the memory control circuit 530 would select one of the RWL sets among last N RWL sets (i.e. RWL sets #13~#15) to replace the defective WL sets according to the steps S803 to S820 of the method described in FIG. 8.

Referring to FIG. 4 and FIG. 7 again, the memory control circuit 503 comprises the comparator circuit 704 and WL/RWL selection circuit 706. The comparator circuit 704 comprise a plurality of comparators, each comparator of the comparator circuit 704 is connected to one of the fuse sets #0~#18 to compare a received address 707 of a WL being accessed by an external command and the addresses recorded in the fuse set connected so as to determine whether the received address hits an address recorded in the fuse set connected. The comparison result is transmitted to the WL/RWL selection logic 706 which determines whether the WL being accessed should be selected normally or an RWL should be selected to replace the WL being accessed.

Specifically, if the received address 707 hits an address recorded in one of the fuse sets #0~#18, an RWL would be selected to replace the WL being accessed. For example, if the received address 707 hits an address recorded in the fuse set #0, then the RWL of the RWL set #0 is selected to replace the WL corresponding the received address. If the received address 707 does not hit any of the addresses recorded in the fuse sets #0~#18, the WL corresponding the received address is selected normally. Further details will be described by the algorithm shown in FIG. 8.

In one embodiment, the memory control circuit 503 may further comprise the availability check logic 805 connected to the fuse sets with the N highest index numbers (hereinafter referred as "last N fuse sets") of the first fuse set group 701. The availability check logic 705 is configured to check the availability of the last N fuse sets and output of availability information to connection interface 510 for external access. In this embodiment, the availability check logic 705 connects to the last three fuse sets #13~#15 and performs a logic function to check the availability of the RWL sets #13~#15 is available.

In one embodiment the post package repair need not to be guaranteed, the availability check logic 705 can perform an OR logic to identify whether there is any available RWL set, thereby whether the post package repair function is supported by the memory device 500 can be quickly identified. In other words, whether the memory device 500 supports the post package repair guaranteed by the JEDEC DDR4 standard can be quickly categorized according to the output of the availability check logic 705.

Figure 8:
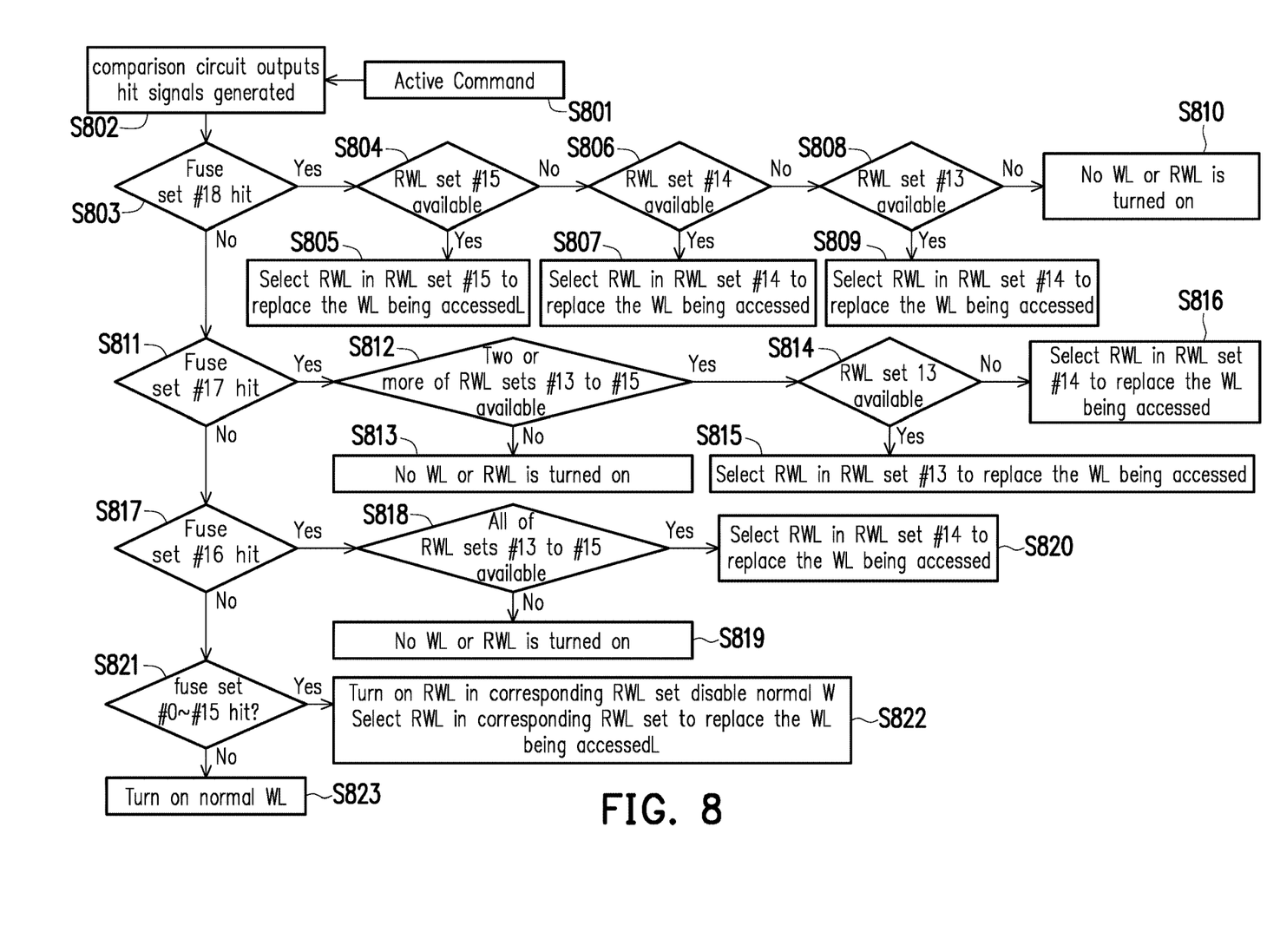
FIG. 8 shows an algorithm implemented by the memory device.

FIG. 8 illustrates the detail algorithm implemented in the WL/RWL selection logic 706. Referring to FIGS. 4, 7 and 8, in step S801, the memory control circuit 530 receives an external command (e.g. active command) which accesses the memory array 550 through the connection interface 510. In step 802, the comparison circuit 704 compares an address of the revived command (hereinafter referred as to "received address") and the addresses recorded in the fuse sets #0~#18, determines whether the received address hits one of the addresses recorded in the fuse sets #0~#18, and outputs the comparison results (hit signal #0~#18) to the WL/RWL selection logic 706. In one embodiment, the hit signals would be high level if the received address hits an address recorded in the fuse sets #0~#18 and low level if the received address does not hit any address recorded in the fuse set #0~#18. In step S803, if the received address hits an address recorded in the fuse set #18 of third fuse set group 703 (i.e. the hit signal #18 is high), then the algorithm proceeds to step S804; otherwise, the algorithm proceeds to step S811.

In step S804, the WL/RWL selection logic 706 checks if RWL set #15 is available. If yes, then in step S805, the WL/RWL selection logic 706 would select an RWL in RWL set #15 to replace WL corresponding to the received address. If RWL set #15 is unavailable, then in step S806, the WL/RWL selection logic 706 checks if RWL set #14 is available. If yes, then in step S807, the WL/RWL selection logic 706 would select an RWL in RWL set #14 to replace WL corresponding to the received address. If RWL set #14 is unavailable, then in step S808, the WL/RWL selection logic 706 checks if RWL set #13 is available. If yes, then in step S809, the WL/RWL selection logic 706 would select an RWL in RWL set #13 to replace WL corresponding to the received address. If RWL set #13 is unavailable, then in step S810, the WL/RWL selection logic 706 would disable the WL corresponding to the received address and no RWL would be turned on.

In step S811, if the received address hits an address recorded in the fuse set #17 of second fuse set group 702 (i.e. the hit signal #17 is high), then the algorithm proceeds to step S812; otherwise, the algorithm proceeds to step S817. It is worth mentioning, in this embodiment, one RWL set is needed to guarantee the post package repair, and another one RWL set is needed when fuse set #17 is used because the fuse set used to record the addresses of the defective WL set in the loop of steps S604~S605 is selected in an order which the one with the highest number is first selected. Therefore, in step S812, the WL/RWL selection logic 706 checks if there are two or more of the RWL set #13~#15 being available. If no, then in step S813, the WL/RWL selection logic 706 would disable the WL which corresponding to the address of the received command, and no RWL would be turned on. If two or more of the RWL sets #13~#15 are available, then in step S814, the WL/RWL selection logic 706 checks if RWL set #13 is available. If yes, then in step S815, the WL/RWL selection logic 706 would select an RWL in RWL set #13 to replace WL corresponding to the received address; otherwise, in step S816, the WL/RWL selection logic 706 would select an RWL in RWL set #14 to replace WL corresponding to the received address.

In step S817, if the received address hits an address recorded in the fuse set #16 of second fuse set group 702 (i.e. the hit signal #16 is high), then the algorithm proceeds to step S818; otherwise, the algorithm proceeds to step S821. It is worth mentioning, in this embodiment, one RWL set is needed to guarantee the post package repair, and another two RWL sets are needed when fuse set #16 is used because the fuse set used to record the addresses of the defective WL set in the loop of steps S604~S605 is selected in an order which the one with the highest number is first selected. Therefore, in step S818, the WL/RWL selection logic 706 checks if all the three RWL sets #13~#15 are available. If yes, then in step S820, the WL/RWL selection logic 706 would select an RWL in RWL set #14 to replace WL corresponding to the received address; otherwise, in step S819, the WL/RWL selection logic 706 would disable the WL corresponding to the received address, and no RWL would be turned on.

In step S821, if the received address hits any of the addresses recorded in fuse sets #0~#15 of first fuse set group 701 (e.g. any of the hit signals #0~#15 is high), then in step S822, the WL/RWL selection logic 706 would select an RWL in the corresponding RWL set to replace WL corresponding to the received address. For example, if the received address hits an address recorded in the fuse set #0, then the memory control circuit 530 would select an RWL in RWL set #0 to replace WL corresponding to the received address. In step S823, since the received address does not hit any of the addresses recorded in the fuse set #0~#18, the memory control circuit 530 would select the WL corresponding to the received address normally.

The procedures for repairing defective WL sets of the memory device during different stages of this invention is summarized below. During the wafer stage, a test is initiated to identify the defective WL sets and defective RWL sets first. Next, the fuse blowing controller of the memory device could be configured to mark all defective RWL sets as being unavailable. Then, if the number of available RWL sets identified is less than the number of defective WL sets, the memory device is discarded. If the number of available RWL sets identified is more than or equal to the number of defective WL sets, the addresses of defective WL sets are recorded in the fuse set of the first fuse set group.

During the package stage, a test is initiated to identify the defective WL sets. If number of defective WL sets is more than K, the memory device is discarded. Otherwise, the addresses of defective WL sets are recorded in the fuse sets of the second fuse set group. And a final test is performed to confirm if each defective WL sets recorded in the fuse sets can be repair by an RWL set normally.

During the post package stage, user can record the address of the defective WL set in the fuse set of the third fuse set group.

It is worth mentioning, each fuse set of the first fuse set group are pre-configured to correspond one of the RWL set, and the fuse sets of the first fuse set is sequentially selected in a predetermined order to record the defective WL sets identified during the wafer stage. In other words, the RWL sets are sequentially selected to replace the defective WL sets in the predetermined order so as to maximize the availability of the last N RWL sets during the wafer stage.

When the addresses recorded in the fuse set of the second and third fuse set group are accessed, the RWL sets of the last N RWL sets are selected to replace to defective WL set corresponding to the addresses being accessed.

In view of the aforementioned descriptions, the disclosure is suitable for being used in a memory device and is able to repair defective WL sets during each of the wafer stage, package stage, and post package stage in a manner that is cost efficient by increasing the availability of RWL sets at each of the three stages with reasonable hardware costs.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory device comprising:
   a plurality of word lines grouped into a plurality of word line (WL) sets; and
   a plurality of redundant word lines grouped into M redundant word line (RWL) sets;
   a memory control circuit connected to the WL sets and the RWL sets and configured to replace a plurality of defective WL sets of the plurality WL sets by selecting from the RWL sets; and
   a plurality of fuse sets, wherein each of the plurality of fuse sets comprise a plurality of fuses used to record the addresses of one of the defective WL sets and to record an availability of the fuse set, wherein
   each of the plurality of defective WL sets comprises at least a defective word line,
   all of the M RWL sets are available for repairing the WL sets during a wafer stage, where M is an integer greater than 2, and
   N of M RWL sets is available for repairing the WL sets during the wafer stage, during a package stage and during a post package stage, where N is an integer less than M,
   wherein the plurality of fuse sets are grouped into a first fuse set group, a second fuse set group, and a third fuse set group, wherein fuse sets of the first fuse set group are used to record addresses of defective WL sets during the wafer stage exclusively, fuse sets of the second fuse set group are used to record addresses of defective WL sets during package stage exclusively, and fuse sets of the third fuse set are used to record group addresses of defective WL sets during post package stage exclusively.

2. The memory device of claim 1
wherein memory control circuits is further configured to:
receive an external command to access a WL through a connection interface,
determine if the address of the WL being accessed matches an address recorded in the fuse sets, and
select an RWL to replace the WL being accessed if the address of the WL being accessed matches the address recorded in the fuse sets.

3. The memory device of claim 2 further comprising:
a fuse blow controller connected to the memory control circuit and configured to record addresses of the defective WL sets by blowing fuses of an available fuse set, and to mark the fuse set blown as being unavailable.

4. The memory device of claim 3, wherein each of the plurality of fuse sets further comprises a fuse dedicated for recording the availability of the fuse set, and the fuse blowing controller is configured to blow the fuse so as to mark the fuse set comprising the fuse as being unavailable.

5. The memory device of claim 1, wherein the first fuse set comprises M fuse sets, and each fuse set of the first fuse set group is pre-configured to correspond one of the M RWL set.

6. The memory device of claim 1, wherein each fuse set of the second fuse set group and the third fuse set group further comprises a fuse for recording a memory bank information of the defective WL set recorded in the fuse set.

7. The memory device of claim 1, wherein a total quantity of the second fuse set group plus a total quantity of the third fuse set group is less than or equals to N.

8. The memory device of claim 1, wherein the memory controller is configured to repair the defective WL sets during the wafer stage, comprising:
identify defective WL sets of the plurality of WL sets and defective RWL sets of the plurality of RWL sets,
mark the fuse sets in the first fuse set group corresponding to the defective RWL sets as unavailable, and
record the addresses of a remaining defective WL set in an available fuse set of the first fuse set group.

9. The memory device of claim 8, wherein record the addresses of the remaining defective WL set in an available fuse set of the first fuse set group comprising:
record the address of the remaining defective WL set in a fuse set having a lowest index number in the first fuse set group.

10. The memory device of claim 8, wherein record the addresses of the remaining defective WL set in an available fuse set of the first fuse set group comprising:
record the address of the remaining defective WL set in a fuse set having an index number determined according to a predetermined order in the first fuse set group.

11. The memory device of claim 1, wherein the memory controller is configured to repair the defective WL sets during the package stage comprising:
identify defective WL sets; and
record the addresses of a remaining defective WL set in an available fuse set of the second fuse set group.

12. The memory device of claim 11, wherein record the addresses of the remaining defective WL set in an available fuse set the second fuse set group comprising:
record the address of the remaining defective WL set in a fuse set having a highest index number in the second fuse set group.

13. The memory device of claim 2, wherein the memory control circuit comprises a plurality of comparators as each of the plurality of comparators is configured to compare the address of the WL being accessed with an address recorded in one of the fuse sets to generate a comparison result.

14. The memory device of claim 13, wherein the memory control circuit further comprises a selection logic configured to receive the comparison result of the comparator to determine whether the word line being accessed should be turned on normally or a redundant word line should be turned on.

15. The memory device of claim 5, wherein the memory control circuit further comprises an availability check logic connected to the last N fuse set of the first fuse set group and output the availability information of the last N fuse set of the first fuse set group.

16. The memory device of claim 15, wherein availability information of the last N fuse set of the first fuse set group is used to categorize whether the memory device supports the post package repair guaranteed by the JEDEC DDR4 standard.

17. The memory device of claim 1, wherein the wafer stage occurs when the memory device is in a wafer which is not cut into a die.

18. The memory device of claim 1, wherein the package stage occurs after the wafer stage and occurs when the memory device is packaged before shipping to a vendor.

19. The memory device of claim 1, wherein the post package stage occurs after the package stage as the memory device is in use by a consumer.

* * * * *